(12) United States Patent
Hopp et al.

(10) Patent No.: US 12,094,902 B2
(45) Date of Patent: Sep. 17, 2024

(54) IMAGE SENSOR ASSEMBLY

(71) Applicant: Leica Camera AG, Wetzlar (DE)

(72) Inventors: Benjamin Hopp, Giessen (DE); Mike Pfeiffer, Wetzlar (DE)

(73) Assignee: Leica Camera AG, Wetzlar (DE)

( * ) Notice: Subject to any disclaimer, the term of this patent is extended or adjusted under 35 U.S.C. 154(b) by 139 days.

(21) Appl. No.: 17/631,834

(22) PCT Filed: Jul. 23, 2020

(86) PCT No.: PCT/EP2020/070798
§ 371 (c)(1),
(2) Date: Jan. 31, 2022

(87) PCT Pub. No.: WO2021/018726
PCT Pub. Date: Feb. 4, 2021

(65) Prior Publication Data
US 2022/0278154 A1 Sep. 1, 2022

(30) Foreign Application Priority Data

Jul. 31, 2019 (DE) .................... 10 2019 120 668.5

(51) Int. Cl.
*H01L 27/146* (2006.01)
*G03B 11/00* (2021.01)

(52) U.S. Cl.
CPC ........ *H01L 27/14625* (2013.01); *G03B 11/00* (2013.01); *H01L 27/14618* (2013.01); *H01L 27/14623* (2013.01)

(58) Field of Classification Search
CPC ......... H01L 27/14618; H01L 27/14623; H01L 27/14625; H01L 27/14621; H04N 23/51; H04N 23/55
See application file for complete search history.

(56) References Cited

U.S. PATENT DOCUMENTS

| 3,438,692 | A | 4/1969 | Tabor |
| 6,870,687 | B2 * | 3/2005 | Obama ............... G02B 5/22 |
| | | | 359/656 |
| 9,322,965 | B2 * | 4/2016 | Osawa ............... G02B 5/285 |
| 10,051,165 | B2 | 8/2018 | Sperber |

(Continued)

FOREIGN PATENT DOCUMENTS

| DE | 1 497 631 A1 | 7/1969 |
| DE | 1 946 435 A1 | 4/1970 |

(Continued)

OTHER PUBLICATIONS

German Search Report dated May 5, 2020 of corresponding German Patent Application No. 10 2019 120 668.5 (seven pages).

(Continued)

*Primary Examiner* — Marly S Camargo
(74) *Attorney, Agent, or Firm* — Kilpatrick Townsend & Stockton LLP (57) ABSTRACT

A sensor unit for an image recording device comprises an optoelectronic image sensor and a cover unit arranged in front of the optoelectronic image sensor. The cover unit comprises a first absorption glass and a second absorption glass, wherein the first absorption glass is configured as a UV absorption glass and the second absorption glass is configured as an IR absorption glass.

21 Claims, 8 Drawing Sheets

(56) References Cited

U.S. PATENT DOCUMENTS

| | | |
|---|---|---|
| 2003/0197947 A1 | 10/2003 | Obama et al. |
| 2009/0002526 A1 | 1/2009 | Koishi |
| 2013/0207058 A1 | 8/2013 | Wegener et al. |
| 2013/0335784 A1 | 12/2013 | Kurtz et al. |
| 2014/0091419 A1 | 4/2014 | Hasegawa et al. |
| 2014/0139912 A1 | 5/2014 | Osawa et al. |
| 2015/0146057 A1 | 5/2015 | Konishi et al. |
| 2016/0139426 A1 | 5/2016 | Park |
| 2017/0017023 A1 | 1/2017 | Sugiyama et al. |
| 2024/0085604 A1* | 3/2024 | Biertümpfel ........... G03B 17/17 |

FOREIGN PATENT DOCUMENTS

| | | |
|---|---|---|
| DE | 690 22 243 T2 | 7/1996 |
| DE | 10 2013 218 100 A1 | 3/2015 |
| EP | 1 701 182 A1 | 9/2006 |
| EP | 2 573 057 B1 | 12/2015 |
| GB | 2 253 762 A | 9/1992 |
| JP | 1988-211670 A | 9/1988 |
| JP | S63211670 A | 9/1988 |
| JP | S-63254401 A | 10/1988 |
| JP | 2002-373977 A | 12/2002 |
| JP | 2003-163297 A | 6/2003 |
| JP | 2005-086100 A | 3/2005 |
| JP | 6034785 B2 | 11/2016 |
| JP | 2019-053268 A | 4/2019 |
| KR | 10-1764084 B1 | 11/2016 |
| WO | 2014/163040 A1 | 10/2014 |

OTHER PUBLICATIONS

International Search Report (ISR) mailed Oct. 30, 2020 in related International Application No. PCT/EP2020/070798 (four pages).
Korean Office Action dated Apr. 29, 2024 from related Korean Application No. 10-2022-7006484 (seven pages).
Japanese Office Action dated Apr. 16, 2024 in related Japanese Application No. 2022-506192 (five pages).

* cited by examiner

IMAGE SENSOR ASSEMBLY

This application is a U.S. National Phase Application of PCT/EP2020/070798, filed Jul. 23, 2020, which claims the priority of German Patent Application 10 2019 120 668.5, filed Jul. 31, 2019, the entireties of which are incorporated by reference herein.

The present invention relates to a sensor unit for an image recording device and to an image recording device having such a sensor unit.

The invention in particular relates to optoelectronic image recording devices, for instance photo or video cameras, having an optoelectronic semiconductor sensor. Such semiconductor sensors typically detect electromagnetic radiation in a spectral range that is larger than the visible spectrum. This has the consequence that electromagnetic radiation having wavelengths close to the boundaries of the visible spectrum can cause various aberrations.

For example, typical semiconductor sensors are particularly sensitive with respect to infrared light, which can lead to a faulty red color reproduction of the semiconductor sensor. Blooming can, for example, arise around light sources or synthetic materials having a high reflection in the infrared range can be incorrectly reproduced in terms of color.

In addition, lens aberrations of typical objectives in the boundary region of the visible spectrum are no longer completely corrected. The steeper refractive power curve of typical lens materials near the ultraviolet spectral range in particular allows the longitudinal chromatic aberration of such objectives to increase and leads to blurred color fringes at the boundary of the visible spectral range.

It can furthermore occur that semiconductor sensors having color filters misinterpret the light in the boundary regions of the visible spectrum. For example, the red color pigment of such a color filter can have a secondary transmission near the ultraviolet spectral range so that magenta-colored chromatic aberrations can occur on the simultaneous transmission of the blue and red color pigments. A combination of a fuzzy image near the ultraviolet spectral range with a magenta-colored interpretation of the fuzzily imaged radiation by the semiconductor sensor then leads to a characteristic purple fringing.

To avoid such aberrations, the incident electromagnetic radiation is therefore typically limited to a suitable spectral range in the case of optoelectronic image recording devices. For this purpose, cover glass structures, among other things, can be used that cover the optoelectronic semiconductor sensor at the object side and that have one or more filter elements. In addition to a limitation of the spectral range of the incident light (spectral filtering), such cover glass structures also serve to protect the semiconductor sensor from contamination and environmental influences and to enable a cleaning of the outer side of the sensor structure without damaging the semiconductor sensor itself.

Cover glass structures of optoelectronic semiconductor sensors typically comprise an infrared absorption glass (IR absorption glass) that limits the electromagnetic radiation in the red spectral range incident on the cover glass structure in that radiation of the respective spectral range is absorbed in the absorption glass. Pure IR absorption glasses, however, only insufficiently limit the spectrum of the incident electromagnetic radiation. This in particular applies in spectral ranges near the ultraviolet range.

Therefore, the spectrum of the incident radiation is typically limited by means of additional UV barrier layers that are applied to a carrier glass, for example the IR absorption glass of the cover glass structure, in thin-film technology and that are typically designed as interference layers. Such barrier layers transmit the electromagnetic radiation incident on the sensor structure in a spectral range designated as the pass band and reflect the incident radiation in a spectral range designated as the cut-off band.

A disadvantage of reflective barrier layers is that their reflectivity usually varies greatly with the angle at which the electromagnetic radiation is incident on the barrier layer and radiation incident in a flat manner on the barrier layer is often only insufficiently reflected and can therefore be incident on the sensor. Radiation incident at flat angles of incidence in particular occurs in compact image recording devices, for example, in mirrorless system cameras.

It is an object of the invention to provide a sensor unit for an image recording device and an image recording device such that aberrations, in particular aberrations occurring in the short-wave spectral range, are avoided.

This object is satisfied by a sensor apparatus and an image recording device in accordance with the independent claims. Further developments are respectively set forth in the dependent claims.

A sensor unit for an image recording device comprises an optoelectronic image sensor and a cover unit arranged in front of the optoelectronic image sensor, wherein the cover unit comprises a first absorption glass and a second absorption glass, and wherein the first absorption glass is configured as a UV absorption glass and the second absorption glass is configured as an IR absorption glass.

Unlike previously known sensor units, a UV absorption glass, which does not reflect ultraviolet radiation but absorbs it, is therefore used in the described sensor unit for filtering the incident electromagnetic radiation in the ultraviolet spectral range. Compared to the conventionally used UV barrier layers, this has the advantage that the radiation retained by the absorption glass is removed from the optical system of the image recording device and can no longer, for example due to multiple reflections and flat angles of incidence occurring on so doing onto the barrier layer, pass through the cover unit. This reduces colored lens reflections in the images that are recorded by the sensor unit and that are often perceived as disturbing and unnatural.

Colored lens reflections inter alia occur in cover units equipped with barrier layers when the reflected blue portion of the electromagnetic radiation incident on the sensor unit is reflected back again in the direction of the sensor unit at an objective arranged in front of the sensor unit. In this respect, the greater the angle of incidence of the radiation reflected back from the objective measured with respect to the normal of the cover unit is, the greater the portion of the radiation that is transmitted through the barrier layer due to the angle-dependent filter characteristic of said barrier layer will be as well. This is in particular a problem for image recording devices having small back focal lengths, such as mirrorless system cameras, since due to the short distance between the image sensor and the rearmost optical element of an objective arranged in front of the image sensor, radiation reflected at the objective at large angles can also still be incident on the sensor unit again.

The first absorption glass and/or the second absorption glass can each include one or more dyes that absorb electromagnetic radiation passing through the absorption glass in a wavelength-selective manner.

The first absorption glass, which is configured as a UV absorption glass, forms a long pass filter in the visible spectral range (380 nm to 740 nm). The first absorption glass can be configured such that a cutoff wavelength of the first absorption glass at which an external transmission of the first absorption glass amounts to 50% (UV50%), is in the blue spectral range. Furthermore, the first absorption glass can be configured such that its transmission is above 50% at all the wavelengths of the visible spectral range that are greater than the UV50% cutoff wavelength and is below 50% at all the wavelengths of the visible spectral range that are less than the UV50% cutoff wavelength.

The UV50% cutoff wavelength can, for example, be between 380 nm and 450 nm, approximately between 405 nm and 430 nm, preferably between 415 nm and 420 nm, for instance 417 nm. The first absorption glass can, for example, be a glass that is marketed under the name UV CLEAR 8010HT by the company Corning SAS, France. The first absorption glass can also be a glass that is marketed under the name UV418 by the company Corning SAS, France, or a glass that is marketed under the name GG435 by the company Schott AG, Germany. The first absorption glass can have a thickness of between 0.1 and 0.7 mm, for example between 0.2 mm and 0.6 mm, for instance of 0.3 mm or 0.5 mm, in a thickness direction oriented perpendicular to a surface of the image sensor forming a detection surface of the image sensor.

The second absorption glass, which is configured as an IR absorption glass, forms a short-pass filter in the visible spectral range. The second absorption glass can be configured such that a cutoff wavelength of the second absorption glass, at which an external transmission of the second absorption glass amounts to 50% (IR50%), is in the red spectral range. Furthermore, the second absorption glass can be configured such that its transmission is above 50% at all the wavelengths of the visible spectral range that are smaller than the IR50% cutoff wavelength and below 50% at all the wavelengths of the visible spectral range that are greater than the IR50% cutoff wavelength. The IR50% cutoff wavelength can, for example, be between 520 nm and 700 nm, for instance between 580 nm and 610 nm, preferably between 585 nm and 600 nm, for instance be 587 nm or 592 nm. The second absorption glass can generally have a thickness between 0.4 mm and 1.0 mm, in particular between 0.5 mm and 0.8 mm, in the thickness direction.

The second absorption glass can, for example, be a glass that is sold under the name IR584-18a by the company MATSUNAMI GLASS IND., LTD. Japan. In this case, the second absorption glass can in particular have a thickness between 0.4 and 0.8 mm, for example between 0.5 mm and 0.7 mm, for instance of 0.60 mm, in the thickness direction. It can also be a glass that is marketed under the name IR584-16a by the company MATSUNAMI GLASS IND., LTD., Japan. In this case, the second absorption glass can in particular have a thickness between 0.6 and 1.0 mm, for example between 0.7 mm and 0.8 mm, for instance of 0.76 mm, in the thickness direction. In addition, the second absorption glass can be a glass sold under the name CXA700 by HOYA CANDEO OPTRONICS, Japan. In this case, the second absorption glass can in particular have a thickness between 0.4 mm and 0.7 mm, for example between 0.5 mm and 0.6 mm, for instance of 0.57 mm, in the thickness direction.

Surfaces of the cover unit that form a glass-air transition can each be coated with an anti-reflective coating. This in particular applies to an object-side front surface remote from the image sensor and to an image-side rear surface of the cover unit facing the image sensor.

The total cover unit, including possibly present coatings, can have a cut-off band having a UV50% cut-off wavelength that lies in a range of at most +/−30 nm, in particular at most +/−20 nm, preferably at most +/−10 nm, around a wavelength of 425 nm. Furthermore, the total cover unit can have an IR50% cutoff wavelength that is in a range of (620+1-50) nm, in particular in a range of (600+1-25) nm, preferably in a range of (595+1-10) nm.

The first absorption glass and the second absorption glass can be plate-shaped and can be aligned in parallel with the detection surface of the semiconductor sensor. The first absorption glass and the second absorption glass can be arranged behind one another along an optical axis oriented perpendicular to the detection surface of the semiconductor sensor.

The first absorption glass and the second absorption glass can contact one another and can be directly connected to one another, for example, adhesively bonded, cemented, or bonded by optical contacting. However, the first absorption glass and the second absorption glass can also be arranged spaced apart from one another and can, for example, be connected to one another via a spacer. In this case, a free space can, for example, be present between the first absorption glass and the second absorption glass.

In addition to the first absorption glass and the second absorption glass, the cover unit can comprise even further absorption glasses, barrier layers, in particular one or more IR barrier layers and/or one or more UV barrier layers, anti-reflective coatings, or further optical elements. The cover unit can be connected to the optoelectronic image sensor, for instance via a housing of the image sensor. The cover unit can, for example, be adhesively bonded to the optoelectronic image sensor, in particular to its housing, or can be connected thereto by means of a clamping element. The sensor unit comprising the cover unit and the optoelectronic image sensor can be arranged in a housing of an image recording device and can be connected thereto, for example screwed thereto.

The optoelectronic image sensor can be configured as a semiconductor sensor, for example, as a CMOS or a CCD sensor. The detection surface of the semiconductor sensor can have a diagonal that is at least as large as the back focal length of an image recording device comprising the sensor unit, for example, one times, or 1.2 times, or 1.5 times as large.

In a further development of the sensor unit, the first absorption glass is arranged at a front side of the second absorption glass remote from the image sensor. A rear side of the second absorption glass remote from the front side can thereby be arranged directly above a cavity of the sensor unit including the optoelectronic image sensor such that the cavity is only covered by the second absorption glass, but not by the first absorption glass, and outgassing emanating from adhesives, for example outgassing that emanates from adhesives arranged between the first and the second absorption glass, cannot impair the operability of the optoelectronic image sensor.

In an alternative embodiment of the sensor unit, the first absorption glass is arranged at a rear side of the second absorption glass facing the image sensor. In this respect, the second absorption glass can in particular be arranged within a cavity comprising the optoelectronic image sensor such that the sensor unit can have a particularly low overall height along the optical axis.

In a further development of the sensor unit, the cover unit covers a cavity of the sensor unit in which the image sensor is arranged. The cavity is then arranged completely beneath the cover unit. The cover unit can in this respect directly terminate the cavity to the front in the longitudinal direction. However, the cavity can also be closed by an additional element, for instance a clear glass, which likewise covers the cavity and which is connected to the cover unit, and the cover unit covering the cavity can be arranged in front of the additional element. The additional element can in particular be plate-shaped. Since a cover unit covering the cavity is used for filtering the incident electromagnetic radiation, the sensor unit can be designed as particularly compact along the optical axis.

In a further development of the sensor unit, the first absorption glass and/or the second absorption glass is/are configured as a plate-shaped element that has a smaller extent in a thickness direction oriented perpendicular to a surface of the image sensor than in transverse directions aligned in parallel with the surface of the image sensor. The thickness direction can in this respect be oriented along the optical axis. Plate-shaped absorption glasses are particularly easy to manufacture and have no influence on the imaging behavior of an optical system of the image recording device comprising the sensor unit.

In a further development of the sensor unit, the first absorption glass and the second absorption glass are arranged contacting one another and are preferably areally connected to one another, for example, cemented, adhesively bonded, or bonded by optical contacting. Compared to a spaced-apart arrangement of the first and second absorption glasses, there are no glass-air transitions between the absorption glasses when the absorption glasses contact one another so that reflections within the cover unit can be reduced. A connection layer that can, for example, include an adhesive or a putty can be arranged between the mutually contacting absorption glasses to connect them.

In a further embodiment of the sensor unit, a first refractive index of the first absorption glass differs from a second refractive index of the second absorption glass by at most 10%, for example, by at most 3% or at most 1%. Reflections between the first absorption glass and the second absorption glass can thereby in particular be reduced in the case of mutually contacting absorption glasses.

In a further development of the sensor unit, a third refractive index of a connection layer arranged between the first absorption glass and the second absorption glass differs from the first refractive index and/or the second refractive index by at most 10%, for example, by at most 3% or at most 1%. The third refractive index can in particular be disposed between the first refractive index and the second refractive index. A third refractive index selected in this manner leads to particularly small reflections at the boundary surfaces between the first and the second absorption glass.

In a further development of the sensor unit, a smaller one of the two absorption glasses has a smaller extent in a lateral direction oriented in parallel with a surface of the image sensor than a larger one of the two absorption glasses. The larger absorption glass is thereby not completely covered by the smaller absorption glass at its side facing the smaller absorption glass such that the larger absorption glass has an exposed margin. The exposed margin can be peripherally formed around the larger absorption glass, or can be present at only one side of the larger absorption glass in the lateral direction, or can be present at two mutually oppositely disposed sides of the larger absorption glass in the lateral direction. The smaller absorption glass can be the first absorption glass and the larger absorption glass can be the second absorption glass, or vice versa.

In a further development of the sensor unit, the cover unit is disposed on a support surface of a frame of the sensor unit surrounding the optoelectronic image sensor, wherein the support surface is at least partly not covered by the smaller absorption glass in the lateral direction. Since the cover unit is disposed on the frame of the sensor unit, the sensor unit can be designed as particularly compact. For example, an adhesive connection or a clamping connection, which fastens the cover unit to the frame of the sensor unit, can be arranged in the exposed region that is not covered by the smaller absorption glass. The frame can, for example, be part of a housing surrounding the optoelectronic image sensor and can surround a cavity formed in the housing and including the image sensor.

In a further development of the sensor unit, the smaller absorption glass is formed by the first absorption glass and the larger absorption glass is formed by the second absorption glass. An adhesive connection comprising a UV-light-curing adhesive is arranged between the smaller absorption glass and the image sensor in a marginal region of the sensor unit that is not covered by the first absorption glass in the lateral direction. The adhesive connection can, for example, connect the second absorption glass to the frame of the sensor unit surrounding the optoelectronic image sensor. Since the adhesive connection is arranged in the marginal region of the sensor unit that is not covered by the first absorption glass, UV light used to cure the adhesive connection can be irradiated past the first absorption glass onto the adhesive connection.

In a further development, the sensor unit comprises a fastening element with which the cover unit is fastened to the optoelectronic image sensor. In this respect, the fastening element is arranged at a fastening side of the larger absorption glass facing the smaller absorption glass and next to the smaller absorption glass in the lateral direction. In such an arrangement, the sensor unit has a particularly small extent in a longitudinal direction along the optical axis.

The fastening element can in particular be disposed on the larger absorption glass at a front side of the larger absorption glass remote from the optoelectronic image sensor and the smaller absorption glass can likewise be arranged at the front side of the larger absorption glass. The fastening element can comprise a clamping element that is arranged at a lateral side of the larger absorption glass or is peripherally arranged around the larger absorption glass.

In a further development of the sensor unit, the larger absorption glass has, at its side facing the smaller absorption glass, a protective coating that covers at least one exposed region of the larger absorption glass that is not covered by the smaller absorption glass in the lateral direction. Corrosion of the larger absorption glass in the exposed region can thereby be prevented. The protective coating can, for example, simultaneously be designed as an anti-reflective coating.

In a further development of the sensor unit, the protective coating is arranged over the full area at the side of the larger absorption glass facing the smaller absorption glass. The protective coating can in particular also be formed between the smaller absorption glass and the larger absorption glass. Such a protective coating is particularly simple to manufacture. In alternative embodiments, the protective coating can also only be formed in the exposed region not covered by the smaller absorption glass. The exposed region can be formed by the marginal region of the larger absorption glass not covered by the smaller absorption glass.

In a further development of the sensor unit, the cover unit comprises an IR barrier layer. The electromagnetic radiation incident on the optoelectronic image sensor near the infrared wavelength range can additionally be limited by means of an IR barrier layer. This makes it possible to also effectively limit the incident electromagnetic spectrum when the second absorption glass has a comparatively flat filter edge. The IR barrier layer can be formed as an interference layer. It can have a filter edge that is between 650 nm and 700 nm, for example between 670 nm and 680 nm. The IR barrier layer can have a transmission of at most 10%, for example at most 5%, at most 2%, or at most 1%, at 700 nm.

In a further development of the sensor unit, the cover unit comprises a third absorption glass that is configured as an IR absorption glass. The IR barrier layer is in this respect arranged between the second and the third absorption glass. Electromagnetic radiation reflected from the IR barrier layer is thereby absorbed at both sides of the IR barrier layer in one of the IR absorption glasses such that the reflected electromagnetic radiation is removed from the optical path of an image recording device comprising the sensor unit and aberrations caused by the reflected red radiation are avoided. As far as no differences are described, the third absorption glass can be configured as described for the second absorption glass.

The IR barrier layer can be arranged directly between the two IR absorption glasses. One of the two IR absorption glasses, the IR barrier layer, the further IR absorption glass, and the UV absorption glass can in particular be arranged after one another along the optical axis. However, the IR barrier layer can alternatively also be arranged between one of the two IR absorption glasses and the first absorption glass that is configured as a UV absorption glass. One of the two IR absorption glasses, the UV absorption glass, the IR barrier layer, and the further IR absorption glass can in particular be arranged after one another along the optical axis. In all of these designs, the IR absorption glasses, the IR barrier layer, and the UV absorption glass can be arranged directly contacting one another and can in each case be connected to one another.

In addition to the IR barrier layer, the cover unit can also comprise a UV barrier layer. The UV barrier layer can be designed separately from the IR barrier layer or connected to it or be integrated into it.

In a further development of the sensor unit, the third absorption glass is arranged at a side of the second absorption glass remote from the first absorption glass. This makes it possible to arrange the IR barrier layer between the second absorption glass and the third absorption glass. In this respect, the IR barrier layer can in particular be integrated into a connection layer that connects the second absorption glass to the third absorption glass. A cover unit can thereby be realized that, on the one hand, has a steep filter curve in the red spectral range and, on the other hand, has a high absorption irrespectively of the direction from which the radiation is incident on the absorption glass structure.

An image recording device having the aforementioned sensor unit is further specified. In this respect, all the advantages and further developments that were described in connection with the sensor unit also refer to the image recording device.

The image recording device can in particular be configured as a mirrorless system camera. The image recording device can be configured such that the diagonal of the optoelectronic image sensor of the sensor unit is at least as large as the back focal length of the image recording device, for example one times, or 1.2 times, or 1.5 times as large.

The invention will be explained in the following with reference to Figures. In this respect, there are shown in a schematic representation in each case.

Figure 1:
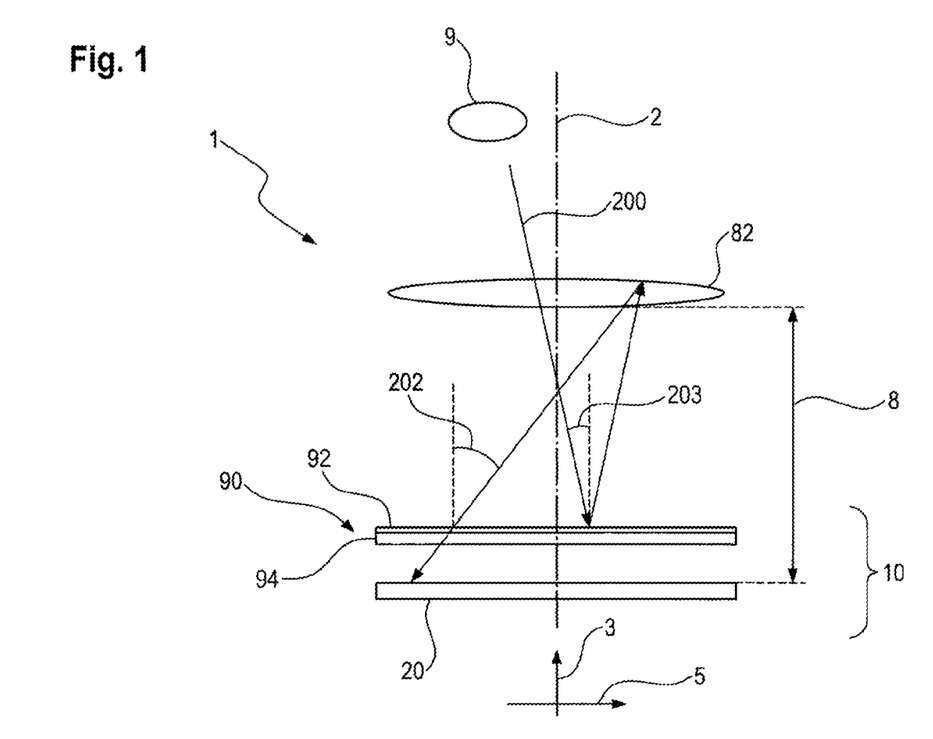
FIG. 1 an image recording device with a sensor unit in accordance with the prior art and an optical element arranged in front of the sensor unit.

FIG. 1 shows a schematic representation of an image recording device 1 comprising a sensor unit 10 in accordance with the prior art. The sensor unit 10 is arranged along an optical axis 2 of the image recording device 1 behind or at the image side of an optical element 82, configured as a lens, of an objective, not shown, of the image recording device 1.

The sensor unit 10 comprises an optoelectronic image sensor 20 and a cover unit 90 arranged along the optical axis 2 in front of the image sensor 20, i.e. at the object side. The cover unit 90, in turn, comprises a plate-shaped absorption glass 94 and a barrier layer 92 arranged at the object-side front side of the absorption glass 94. The absorption glass 94 is configured as an IR absorption glass and the barrier layer 92 is configured as a UV barrier layer. The plate-shaped absorption glass 94 has a larger extent in a transverse direction 5 than in a longitudinal direction 3 oriented along the optical axis 2 and perpendicular to the transverse direction 5.

The optical element 82 forms a final or rearmost optical element of the objective. The image sensor 20 and the optical element 82 are arranged at a spacing from one another that corresponds to a minimum back focal length 8 of the image recording device 1.

As can be seen from FIG. 1, electromagnetic radiation 200 emanating from an object 9 arranged in front of the objective is reflected back in the direction of the objective at the barrier layer 92. Subsequently, a portion of the radiation 200 reflected back is again reflected at the optical element 82 of the objective and is incident on the cover unit 90 again. Depending on the geometry of the optical element 82, a second angle of incidence 202 can in this respect, after the reflection of the re-reflected electromagnetic radiation 200, be greater than a first angle of incidence 203 at which the electromagnetic radiation 200 was previously incident on the cover unit 90. Since the reflectivity of the barrier layer 92 is dependent on the angle and decreases as the angle of incidence 202, 203 increases, the electromagnetic radiation 200 that is reflected back from the optical element 82 and that is incident after the reflection at the larger second angle of incidence 202 passes through the barrier layer 92 and is finally incident on the image sensor 20. An image recorded by the image sensor 20 then shows a lens reflection that has a blue coloring due to the color-selective reflection at the UV barrier layer 92. In particular in an image recording device in which the back focal length 8 is relatively small compared to the extent of the image sensor 20 in the transverse direction 5, large second angles of incidence 202 of up to 40° can occur after the reflection at the objective.

Figure 2:
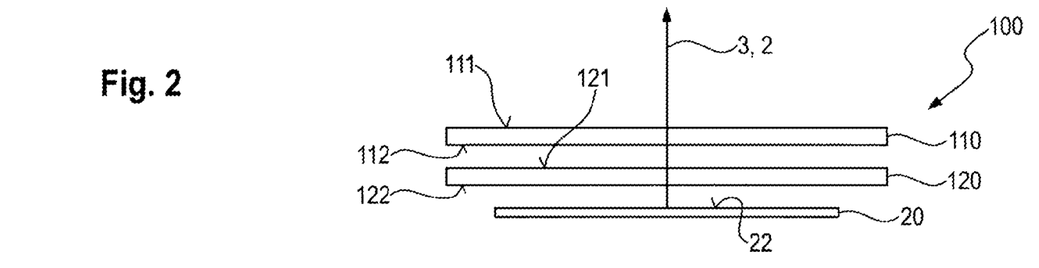
FIG. 2 a cover unit of the sensor unit in accordance with a first embodiment.

To avoid the described colored lens reflections, a cover unit is used in the sensor units 10 in accordance with the invention, said cover unit comprising a UV absorption glass that primarily absorbs and does not reflect the incident electromagnetic radiation in the violet and near-ultraviolet spectral range. FIG. 2 shows a first embodiment of such a cover unit 100.

The cover unit 100 has a first absorption glass 110 configured as a UV absorption glass and a second absorption glass 120 configured as an IR absorption glass. The first and second absorption glasses 110, 120 are spaced apart from one another in front of a surface 22 of the image sensor 20 serving as a detection surface for detecting incident electromagnetic radiation. Starting from the image sensor 20, the second absorption glass 120 is in this respect arranged first in the longitudinal direction 3 along the optical axis 2 and the first absorption glass 110 is arranged in front of the second absorption glass 120. In this respect, a front side 111 of the first absorption glass 110 is arranged facing the incident electromagnetic radiation and a rear side 112 of the first absorption glass 110 disposed opposite the front side 111 is arranged facing the second absorption glass 120. A front side 121 of the second absorption glass 120 is arranged facing the first absorption glass 110 and a rear side 122 of the second absorption glass 120 disposed opposite the front side 121 is arranged facing the image sensor 20.

Figure 3:
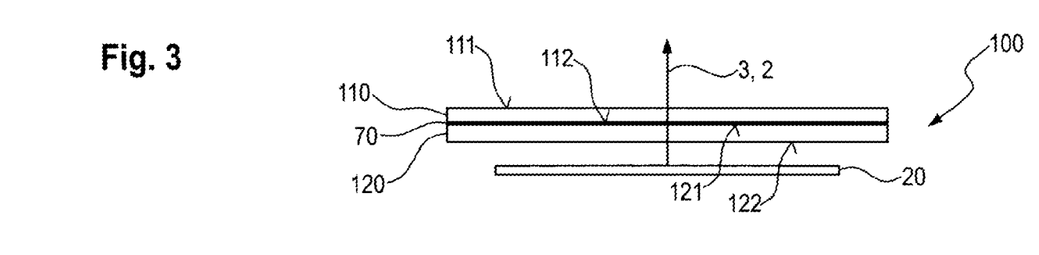
FIG. 3 the cover unit of the sensor unit in accordance with a second embodiment.

FIG. 3 shows a second embodiment of the cover unit 100. Unless differences are described, the second embodiment of the cover unit 100 is configured as is described for the first embodiment of the cover unit 100. In the second embodiment, the first absorption glass 110 and the second absorption glass 120 are not arranged spaced apart from one another, but are arranged contacting one another. Between the first absorption glass 110 and the second absorption glass 120 there is a connection layer 70 that is configured as an adhesive layer and that connects the first and second absorption glasses 110, 120 to one another over the full area.

In the first embodiment shown in FIG. 2 and in the second embodiment shown in FIG. 3, the cover unit 100 can in each case comprise an IR barrier layer that can, for example, be arranged at the front side 111 of the first absorption glass 110. Additionally or alternatively, the cover unit 100 can comprise a respective UV barrier layer that can, for example, likewise be arranged at the front side 111 of the first absorption glass 110.

Figure 4:
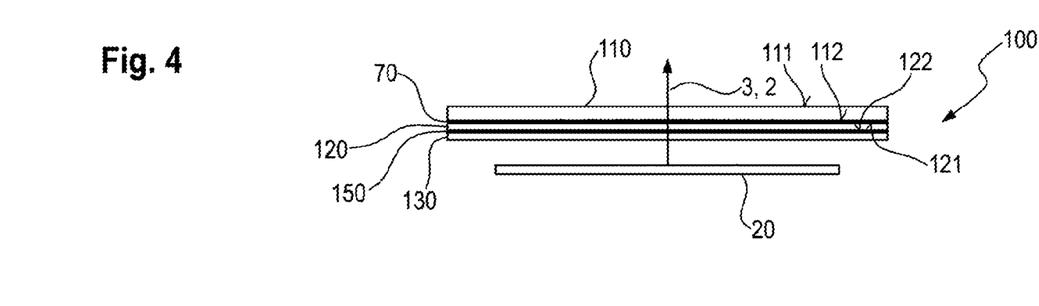
FIG. 4 the cover unit of the sensor unit in accordance with a third embodiment.

FIG. 4 shows a third embodiment of the cover unit 100. Unless differences are described, the third embodiment of the cover unit 100 is configured as is described for the second embodiment of the cover unit 100. The third embodiment of the cover unit 100 comprises a third absorption glass 130 in addition to the first and second absorption glasses 110, 120. The third absorption glass 130 is likewise configured as an IR absorption glass and is arranged at the rear side 122 of the second absorption glass 120 facing the image sensor 20. The second absorption glass 120 and the third absorption glass 130 contact one another. An IR barrier layer 150 is arranged between the second absorption glass 120 and the third absorption glass 130.

Figure 5:
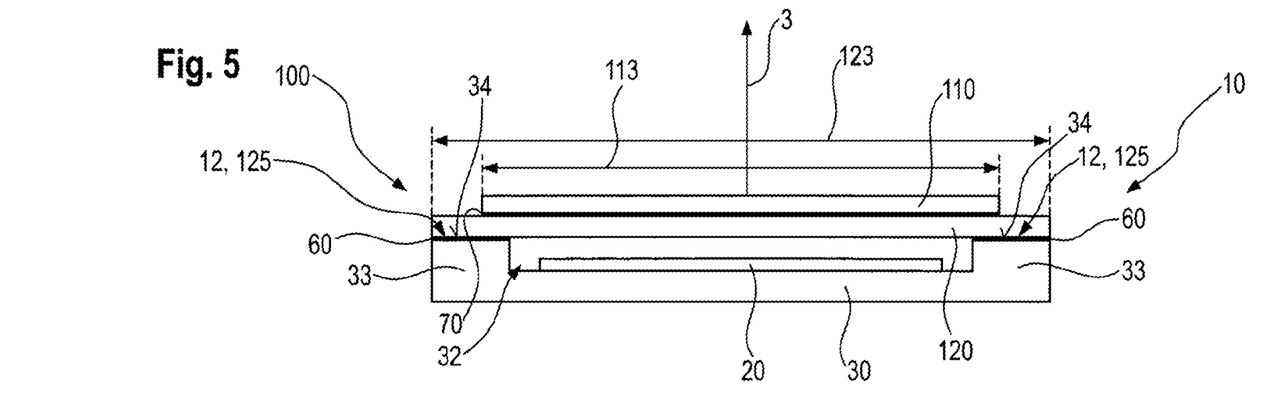
FIG. 5 the sensor unit with a fourth embodiment of the cover unit.

FIG. 5 shows the sensor unit 10 with a fourth embodiment of the cover unit 100. Unless differences are described, the fourth embodiment of the cover unit 100 is configured as is described for the second embodiment. In the fourth embodiment, an extent 113 of the first absorption glass 110 is smaller than an extent 123 of the second absorption glass 120 in the transverse direction 5. The second absorption glass 120 thereby has an exposed region 125 at both sides in a marginal region 12 of the cover unit 100 in the transverse direction 5, which exposed region 125 is not covered by the first absorption glass 110 in the longitudinal direction 3 and in which the second absorption glass 120 is exposed below the first absorption glass 110.

The second absorption glass 120 is disposed, at its rear side 122, on a support surface 34 of a frame 33 of a housing 30 of the sensor unit 10. The frame 33 peripherally bounds a cavity 32 of the housing 30 in which the optoelectronic image sensor 20 is arranged. The cavity 32 is closed in the longitudinal direction 3 by the second absorption glass 120. The second absorption glass 120 is connected to the frame 33 in the exposed region 125 by means of an adhesive connection 60 comprising a UV light-curing adhesive. The adhesive connection 60 is not covered by the first absorption glass 110, which is configured as a UV absorption glass, in the exposed region 125 such that UV light, which is irradiated onto the cover unit 100 from the front for curing the adhesive, can pass by the first absorption glass 110 and can be incident onto the adhesive connection 60 through the second absorption glass 120.

Figure 6:
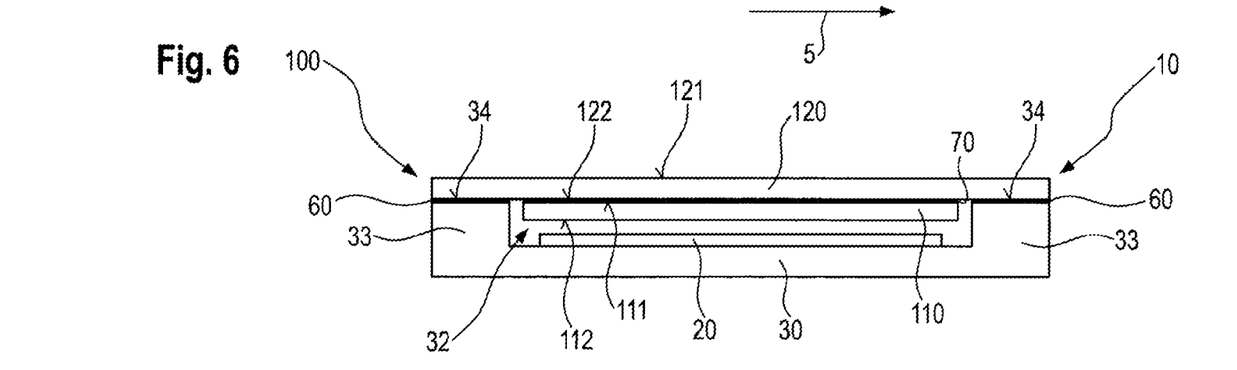
FIG. 6 the sensor unit with a fifth embodiment of the cover unit.

FIG. 6 shows the sensor unit 10 with a fifth embodiment of the cover unit 100. Unless differences are described, the fifth embodiment of the cover unit 100 is configured as is described for the fourth embodiment. In the fifth embodiment, the first absorption glass 110 is arranged at the rear side 122 of the second absorption glass 120 and in the cavity 32. In this embodiment, the front side 111 of the first absorption glass 110 is connected to the rear side 122 of the second absorption glass 120 by means of the connection layer 70. In the fifth embodiment of the cover unit 100, the UV light can be directly irradiated through the second absorption glass 120 to cure the adhesive of the adhesive connection 60 arranged between the second absorption glass 120 and the frame 33 of the housing 30.

Figure 7:
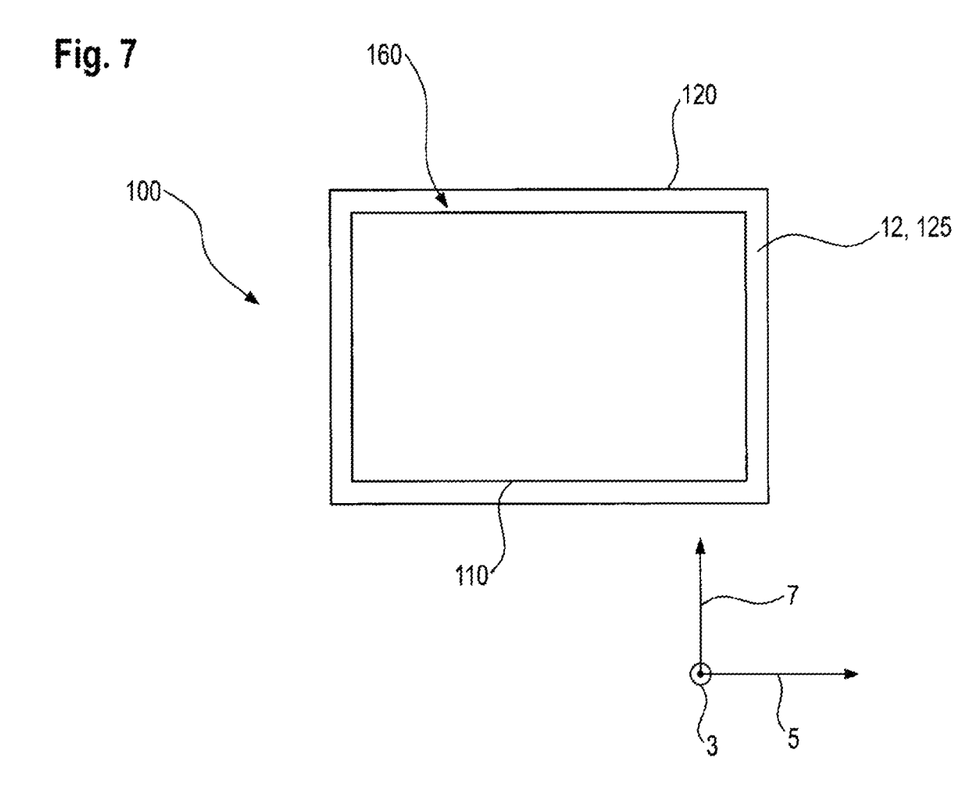
FIG. 7 a plan view of a front side of the cover unit in accordance with the fourth embodiment.

FIG. 7 shows a plan view of a front side of the fourth embodiment of the cover unit 110 shown in FIG. 5. The first absorption glass 110 has a respective extent, which is smaller than a corresponding extent of the second absorption glass 120, both in the transverse direction 5 and in a further transverse direction 7 oriented perpendicular to the transverse direction 5 and to the longitudinal direction 3. The second absorption glass 120 is thereby not covered by the first absorption glass 110 in a peripheral marginal region 12 such that the region 125 of the second absorption glass 120 that is exposed in the marginal region 12 is likewise peripherally formed.

Figure 8:
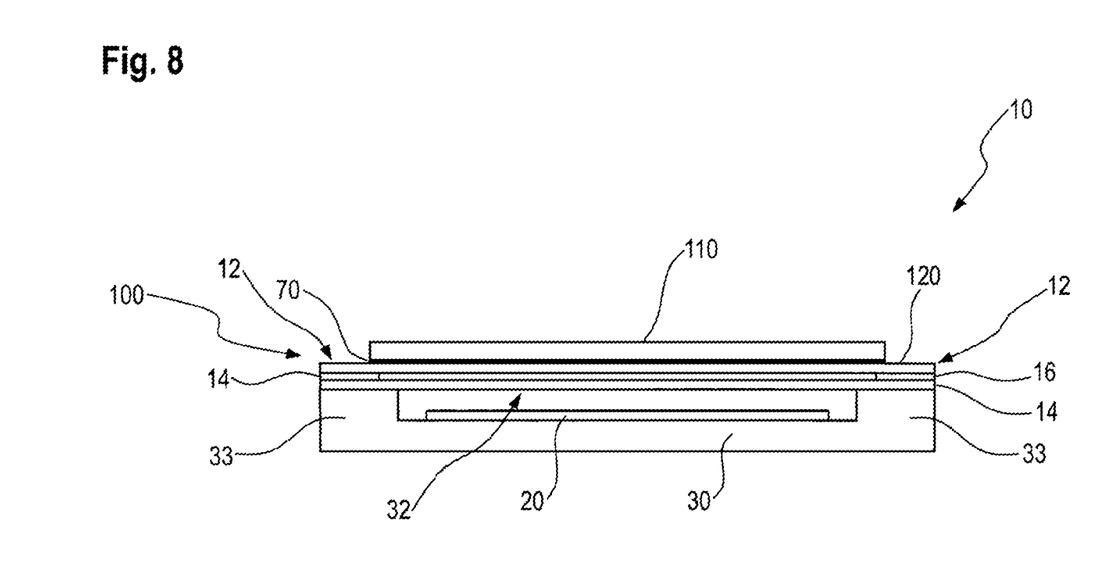
FIG. 8 the sensor unit with a sixth embodiment of the cover unit.

FIG. 8 shows the sensor unit 10 with a sixth embodiment of the cover unit 100. Unless differences are described, the sixth embodiment of the cover unit 100 is configured as is described for the fourth embodiment. In the sixth embodiment, the second absorption glass 120 is not directly disposed on the frame 33 of the housing 30. Instead, a cover glass 14 is arranged in front of the housing 30 and closes the cavity 32 in the longitudinal direction. The cover glass 14 can be configured as a clear glass that transmits incident electromagnetic radiation in the visible spectral range in a substantially unhindered manner. The cover unit 100 is connected to the cover glass 14, wherein a spacer 16 is arranged between the cover unit 100 and the cover glass 14. The cover unit 100 and the cover glass 14 thereby have a spacing from one another in the longitudinal direction 3. The spacer 16 is peripherally formed around the cover unit 100 in the marginal region 12.

Figure 9:
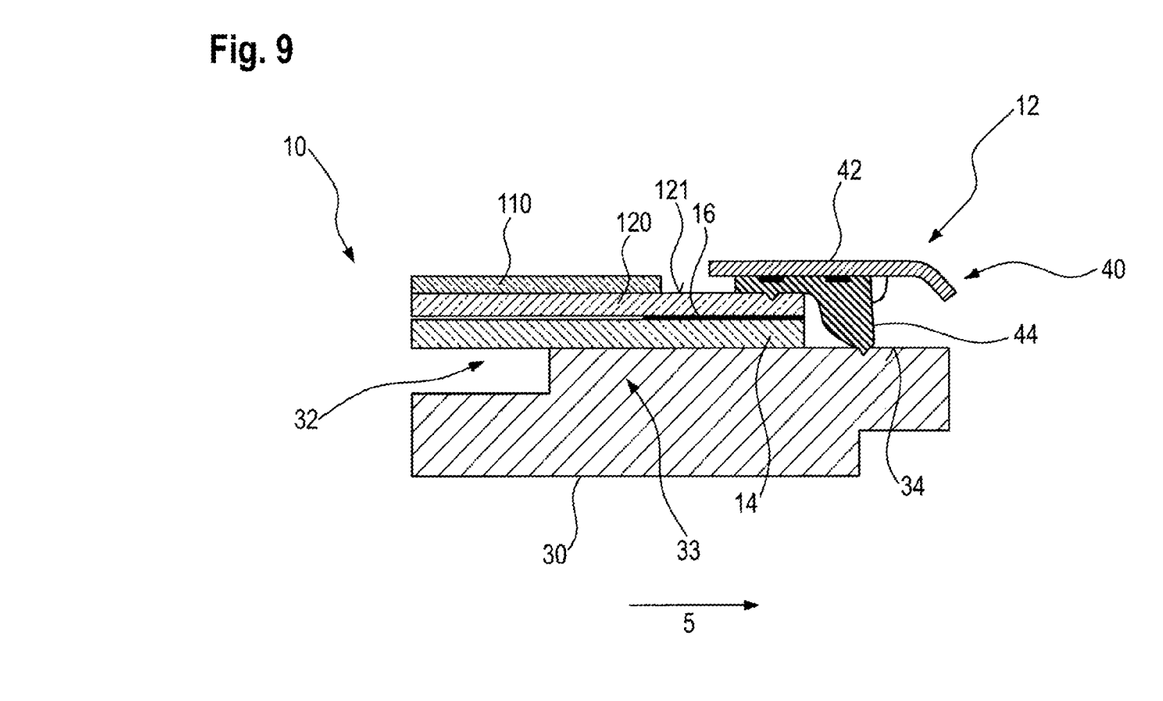
FIG. 9 a detailed view of the sensor unit with the sixth embodiment of the cover unit.

FIG. 9 shows a detailed view of the sensor unit 100 with the sixth embodiment of the cover unit 100. The cover unit 100 is fastened to the housing 30 of the sensor unit 10 by means of a fastening element 40 not shown in FIG. 8. The fastening element 40 is disposed at the front side 121 of the second absorption glass 120 in the marginal region 12 not covered by the first absorption glass 110 and clamps the second absorption glass 120 onto the support surface 34 of the frame 33. The fastening element 40 comprises a clamping element 42 and a sealing element 44 arranged between the clamping element 42 and the second absorption glass 120. The clamping element 42 is peripherally arranged around the cover unit 100 in the marginal region 12 and is configured as a holding plate. The sealing element 44 is likewise peripherally arranged around the cover unit 100 in the marginal region 12 and comprises a resilient material. In the transverse direction 5, the sealing element 44 is also disposed on the frame 33 of the housing 30 in addition to the cover unit 100.

In alternative embodiments of the sensor unit 10 shown in FIG. 8, the spacer 16 can also in each case be connected by means of an adhesive connection, for instance by means of an adhesive connection comprising a UV-light-curing plastic, to the cover unit 100 and the cover glass 14. In these embodiments, the fastening element 40 can be omitted.

Figure 10:
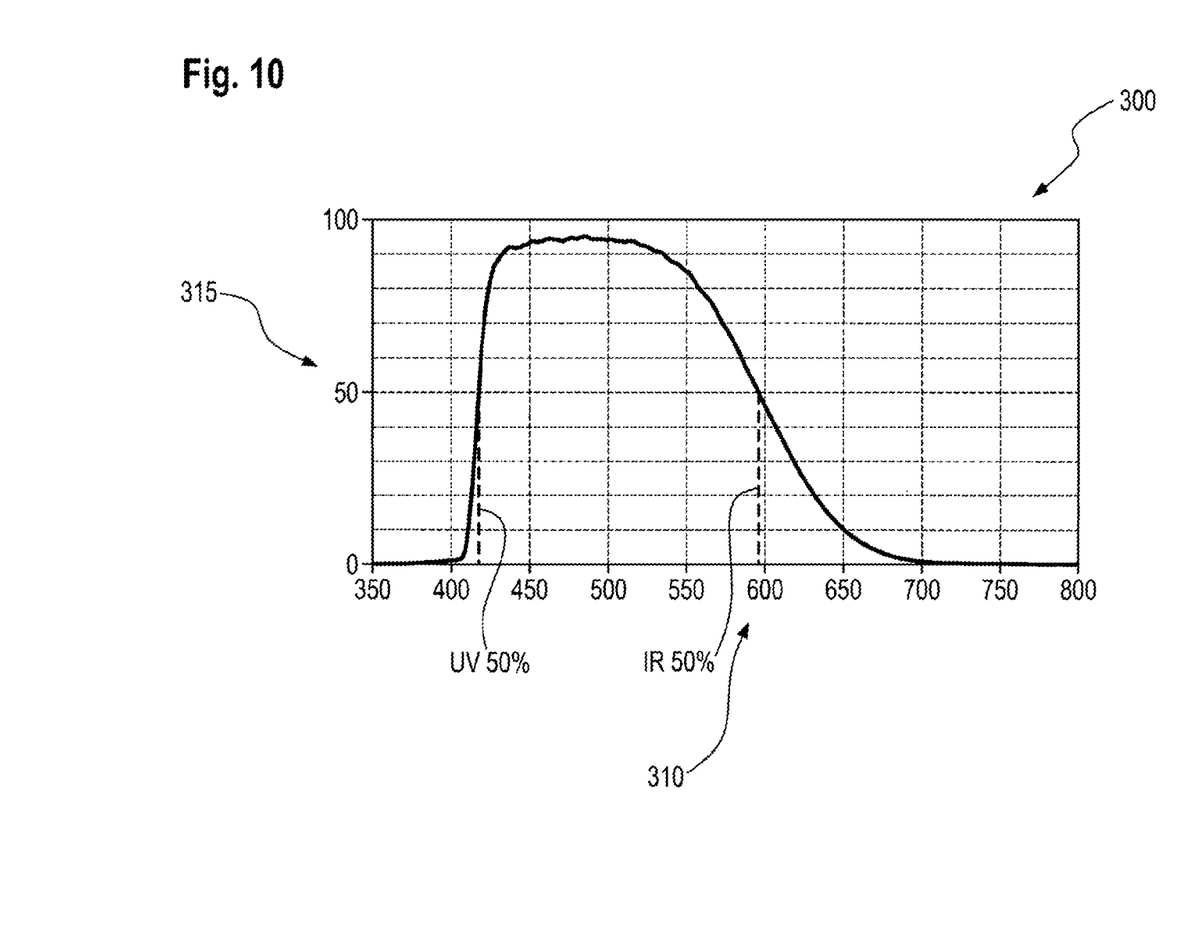
FIG. 10 a transmission curve of the cover unit.

FIG. 10 shows a transmission curve 300 of the second and fourth to sixth embodiments of the cover unit 100, wherein the transmission 315 (in %) of the cover unit 100 is plotted against the wavelength 310 (in nm) of the incident electromagnetic radiation. As can be seen from FIG. 10, the transmission curve 300 has a cutoff wavelength UV50% at 417 nm in the violet spectral range and a cutoff wavelength IR50% at 596 nm in the infrared spectral range. The transmission curve 300 was received using an embodiment of the cover unit 100 that comprises a glass UV8010HT of the company Corning SAS having a longitudinal thickness of 0.3 mm as the first absorption glass 110 and a glass CXA700 of the company Hoya Corporation having a longitudinal thickness of 0.565 mm as the second absorption glass.

Figure 11:
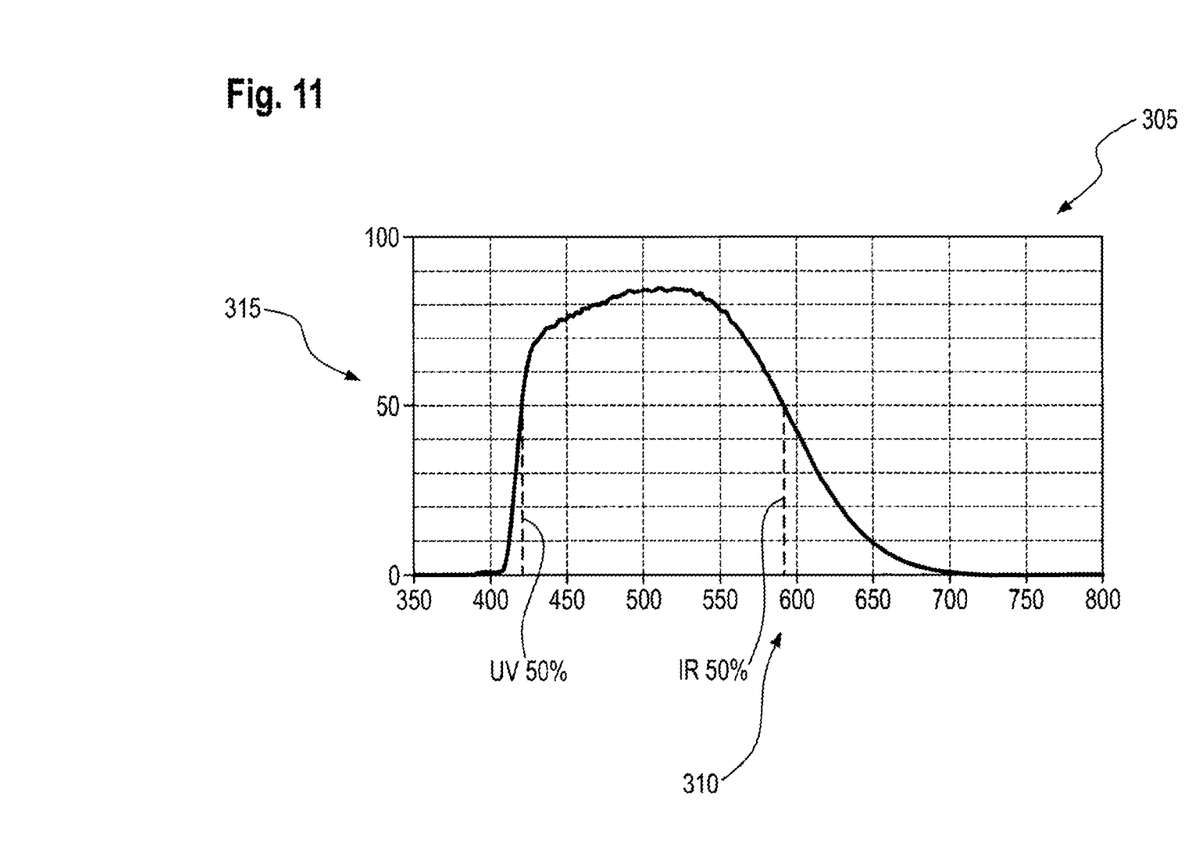
FIG. 11 an alternative transmission curve of the cover unit.

FIG. 11 shows an alternative transmission curve 305 of the second and fourth to sixth embodiments of the cover unit 100. As can be seen from FIG. 11, the transmission curve 305 has a cutoff wavelength UV50% at 419 nm in the violet spectral range and a cutoff wavelength IR50% at 591 nm in the infrared spectral range. The transmission curve 305 was received using an embodiment of the cover unit 100 that comprises a glass UV8010HT of the company Corning SAS having a longitudinal thickness of 0.3 mm as the first absorption glass and comprises a glass IR 584-18α of the company MATSUNAMI GLASS IND., LTD having a longitudinal thickness of 0.762 mm as the second absorption glass.

REFERENCE NUMERAL LIST 1 image recording device
2 optical axis
3 longitudinal direction
5 transverse direction
7 further transverse direction
8 back focal length
9 object
10 sensor unit
12 marginal region
14 cover glass
16 spacer
20 image sensor
22 surface
30 housing
32 cavity
33 frame
34 support surface
40 fastening element
42 clamping element
44 sealing element
60 adhesive connection
70 connection layer
82 optical element
90 cover unit
92 barrier layer
94 absorption glass
100 cover unit
110 first absorption glass
111 front side
112 rear side
113 extent
120 second absorption glass
121 front side
122 rear side
123 extent
125 exposed region
130 third absorption glass
150 IR barrier layer
200 electromagnetic radiation
202 second angle of incidence after reflection
203 first angle of incidence
300 transmission curve
305 alternative transmission curve
310 wavelength
315 transmission

The invention claimed is:

1. An image sensor assembly for an image recording device comprising:
an optoelectronic image sensor; and
a cover arranged in front of the optoelectronic image sensor,
wherein the cover comprises a first absorption glass and a second absorption glass; and
wherein the first absorption glass is configured as a UV absorption glass and the second absorption glass is configured as an IR absorption glass.

2. The image sensor assembly according to claim 1, wherein the first absorption glass is arranged in front of the second absorption glass remote from the image sensor.

3. The image sensor assembly according to claim 1, wherein the first absorption glass is arranged in the rear of the second absorption glass facing the image sensor.

4. The image sensor assembly according to claim 1, wherein the cover covers a cavity of the image sensor assembly in which the image sensor is arranged.

5. The image sensor assembly according to claim 1, wherein the first absorption glass and/or the second absorption glass is/are configured as a plate-shaped element that has a smaller extent in a thickness direction oriented perpendicularly to a surface of the image sensor than in transverse directions aligned in parallel with the surface of the image sensor.

6. The image sensor assembly according to claim 1, wherein the first absorption glass and the second absorption glass are arranged contacting one another.

7. The image sensor assembly according to claim 6, wherein the first absorption glass and the second absorption glass are cemented, adhesively bonded, or bonded by optical contacting.

8. The image sensor assembly according to claim 1,
wherein a first refractive index of the first absorption glass differs from a second refractive index of the second absorption glass by at most 10%.

9. The image sensor assembly according to claim 5,
wherein a third refractive index of a connection layer arranged between the first absorption glass and the second absorption glass differs from the first refractive index and/or the second refractive index by at most 10%.

10. The image sensor assembly according to claim 8,
wherein the first refractive index of the first absorption glass differs from the second refractive index of the second absorption glass by at most 3% or at most 1%.

11. The image sensor assembly according to claim 9,
wherein the third refractive index of a connection layer arranged between the first absorption glass and the second absorption glass differs from the first refractive index and/or the second refractive index by at most 3% or at most 1%.

12. The image sensor assembly according to claim 1,
wherein a smaller one of the two absorption glasses has a smaller extent in a lateral direction oriented in parallel with a surface of the image sensor than a larger one of the two absorption glasses.

13. The image sensor assembly according to claim 12,
wherein the cover is disposed on a support surface of a frame of the image sensor assembly surrounding the optoelectronic image sensor; and
wherein the support surface is at least partly not covered by the smaller absorption glass in the lateral direction.

14. The image sensor assembly according to claim 13,
wherein the smaller absorption glass is formed by the first absorption glass and the larger absorption glass is formed by the second absorption glass; and
wherein an adhesive connection comprising a UV light-curing adhesive is arranged between the second absorption glass and the image sensor in a marginal region of the image sensor assembly that is not covered by the first absorption glass in the lateral direction; and
wherein the adhesive connection connects the second absorption glass to a frame of the image sensor assembly surrounding the optoelectronic image sensor.

15. The image sensor assembly according to claim 12, further comprising:
fastener by which the cover is fastened to the optoelectronic image sensor; and
wherein the fastener is arranged at a fastening side of the larger absorption glass facing the smaller absorption glass and is arranged next to the smaller absorption glass in the lateral direction.

16. The image sensor assembly according to claim 12,
wherein the larger absorption glass has, at its side facing the smaller absorption glass, a protective coating that covers at least one exposed region of the larger absorption glass that is not covered by the smaller absorption glass in the lateral direction.

17. The image sensor assembly according to claim 16,
wherein the protective coating is arranged over a full area at the side of the larger absorption glass facing the smaller absorption glass.

18. The image sensor assembly according to claim 1,
wherein the cover comprises an IR barrier layer.

19. The image sensor assembly according to claim 18,
wherein the cover comprises a third absorption glass that is configured as an IR absorption glass; and
wherein the IR barrier layer is arranged between the second and third absorption glass.

20. The image sensor assembly according to claim 19,
wherein the third absorption glass is arranged at a side of the second absorption glass remote from the first absorption glass.

21. An image recording device sensor unit comprising:
an optoelectronic image sensor; and
a cover arranged in front of the optoelectronic image sensor,
wherein the cover comprises a first absorption glass and a second absorption glass; and
wherein the first absorption glass is configured as a UV absorption glass and the second absorption glass is configured as an IR absorption glass.

* * * * *